(12) United States Patent
Hofmann et al.

(10) Patent No.: US 7,598,543 B2
(45) Date of Patent: Oct. 6, 2009

(54) SEMICONDUCTOR MEMORY COMPONENT WITH BODY REGION OF MEMORY CELL HAVING A DEPRESSION AND A GRADED DOPANT CONCENTRATION

(75) Inventors: Franz Hofmann, Munich (DE); Richard Johannes Luyken, Munich (DE); Wolfgang Roesner, Ottobrunn (DE); Michael Specht, Munich (DE); Martin Staedele, Ottobrunn (DE)

(73) Assignee: Qimonda AG, München (DE)

( * ) Notice: Subject to any disclaimer, the term of this patent is extended or adjusted under 35 U.S.C. 154(b) by 106 days.

(21) Appl. No.: 11/438,883

(22) Filed: May 23, 2006

(65) Prior Publication Data
US 2006/0267082 A1 Nov. 30, 2006

(30) Foreign Application Priority Data
May 31, 2005 (DE) .................. 10 2005 024 951

(51) Int. Cl.
*H01L 27/108* (2006.01)
(52) U.S. Cl. ................ 257/208; 257/296; 257/E27.084
(58) Field of Classification Search .................. 257/300, 257/301, 303, 304, 208, 211, 296, 305, 520, 257/E27.084, E27.092, E27.093
See application file for complete search history.

(56) References Cited

U.S. PATENT DOCUMENTS

| | | | | |
|---|---|---|---|---|
| 3,767,487 | A * | 10/1973 | Steinmaier | 257/370 |
| 5,719,422 | A * | 2/1998 | Burr et al. | 257/336 |
| 6,025,237 | A * | 2/2000 | Choi | 438/301 |
| 6,037,194 | A * | 3/2000 | Bronner et al. | 438/147 |
| 7,265,415 | B2 * | 9/2007 | Shenoy et al. | 257/330 |
| 2003/0015752 | A1 * | 1/2003 | Palm et al. | 257/315 |
| 2003/0170955 | A1 | 9/2003 | Kawamura et al. | |
| 2003/0231521 | A1 * | 12/2003 | Ohsawa | 365/174 |
| 2004/0061148 | A1 | 4/2004 | Hsu | |
| 2005/0064659 | A1 | 3/2005 | Willer | |

OTHER PUBLICATIONS

X. Yang et al. "Tunable Oxie-Bypassed Trench Gate MOSFET: Breaking the Ideal Superjunction MOSFET Performance Line at Equal Column Width." Nov. 2003. IEEE Electron Device Letters, vol. 24, No. 11, pp. 704-706.*
German Office Action dated Jan. 25, 2006.

* cited by examiner

*Primary Examiner*—Minh-Loan T Tran
*Assistant Examiner*—W. Wendy Kuo
(74) *Attorney, Agent, or Firm*—Eschweiler & Associates, LLC

(57) ABSTRACT

A semiconductor memory component comprises at least one memory cell. The memory cell comprises a semiconductor body comprised of a body region, a drain region and a source region, a gate dielectric, and a gate electrode. The body region comprises a first conductivity type and a depression between the source and drain regions, and the source and drain regions comprise a second conductivity type. The gate electrode is arranged at least partly in the depression and is insulated from the body, source, and drain regions by the gate dielectric. The body region further comprises a first continuous region with a first dopant concentration and a second continuous region with a second dopant concentration greater than the first dopant concentration. The first continuous region adjoins the drain region, the depression and the source region, and the second region is arranged below the first region and adjoins the first region.

15 Claims, 7 Drawing Sheets

FIG 4A
FIG 4C
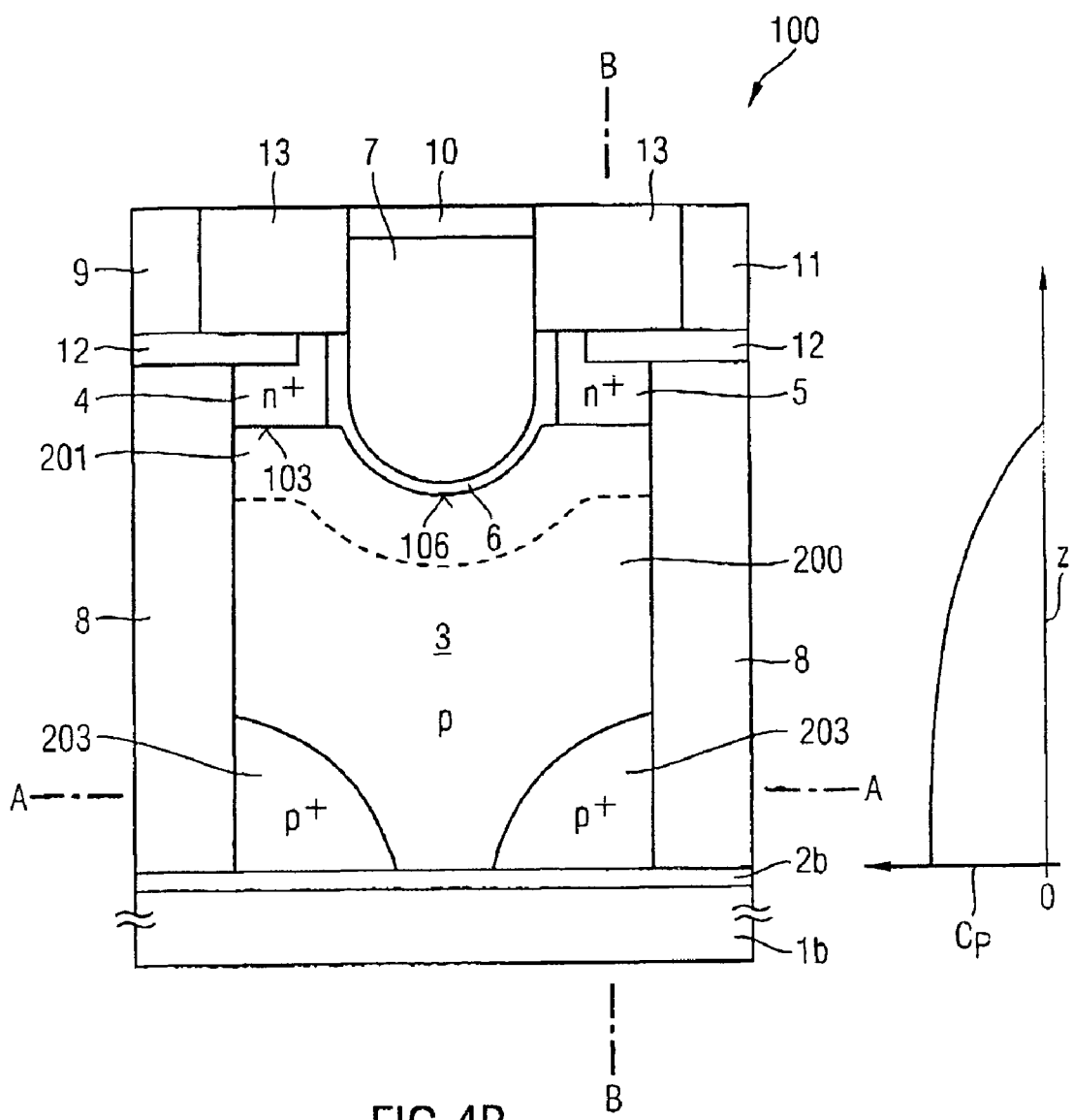
FIG 4B
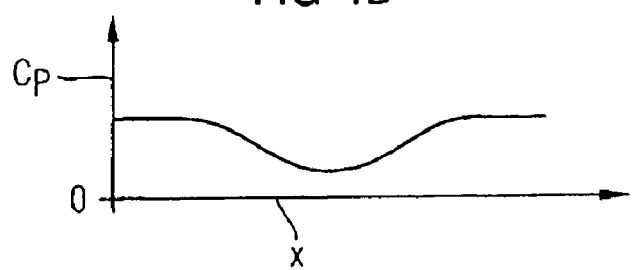

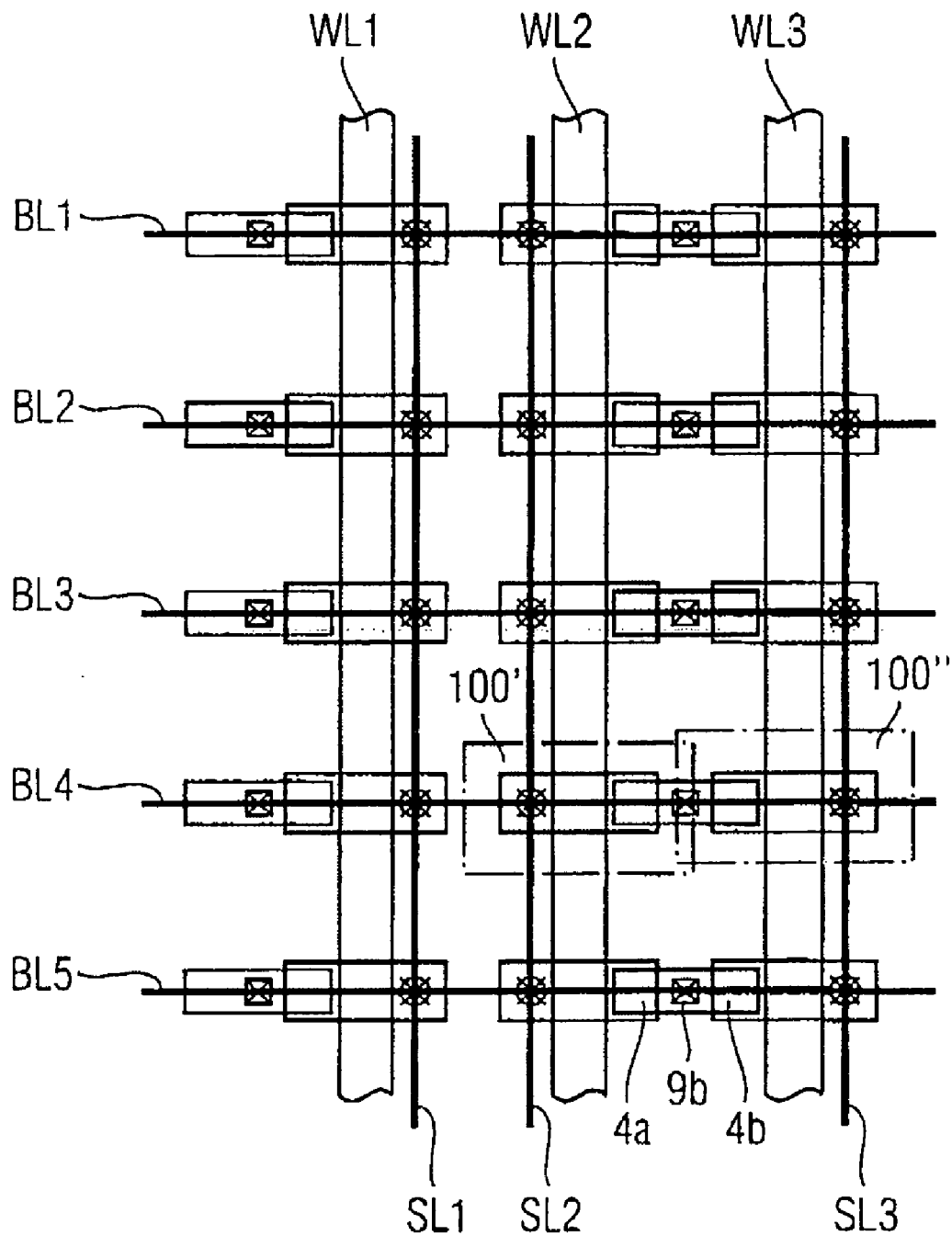

SEMICONDUCTOR MEMORY COMPONENT WITH BODY REGION OF MEMORY CELL HAVING A DEPRESSION AND A GRADED DOPANT CONCENTRATION

BACKGROUND OF THE INVENTION

The present invention relates to a semiconductor memory component.

Although the problem area on which the invention is based is described below with reference to a random access memory, it is not restricted thereto, but rather relates quite generally to semiconductor memory components.

Such a random access memory is for example a DRAM (dynamic random access memory) having a multiplicity of memory cells. Each of the individual memory cells comprises a transistor and a capacitor. Information is stored in the form of a quantity of charge in the capacitor, and it can be accessed by means of the transistor.

For reliable operation of the DRAM, the capacitor must have a minimum capacitance. The capacitance of the capacitor is crucially determined by the area of the electrodes. Therefore, a minimum area of the electrodes is required.

Leakage currents of the transistor discharge the capacitor. This discharge may be compensated for on the one hand by more generous dimensioning of the capacitor. On the other hand, it is also possible to use transistors having a good blocking behavior.

In endeavoring to integrate a larger number of memory cells on an acceptable area, the lateral dimensions of the capacitors and transistors can be reduced. In order that the area of the electrodes does not fall below the minimum area of said electrodes despite the reduced lateral dimensions of said electrodes, vertical electrodes are produced in the case of which the electrodes is placed increasingly into the depth of the semiconductor body. However, the outlay for producing these vertical electrodes increases as the lateral dimensioning decreases.

Another approach for producing memory cells provides for injecting charge carriers into a body region, the drain zone, the source zone and the gate electrode being arranged in said body region or on the body region. The charges in the body region shift the threshold voltage of the transistor typically by several hundred millivolts. Consequently, a body region with injected charges and without injected charges can be distinguished on the basis of the switching behavior of the transistor. Therefore, S. Okhonin et al. in IEEE Electron Device Letters, Vol. 23, No. 2, page 85, February 2002, proposed producing memory cells based on this principle. It is disadvantageous, however, that the storage durations of the charges in the body region are only in the range of a few milliseconds instead of corresponding to the required specification of a storage duration of approximately 250 ms for a memory cell.

BRIEF SUMMARY OF THE INVENTION

A semiconductor memory component comprises at least one memory cell. The memory cell comprises: a semiconductor body of the first conductivity type, a source region and a drain region of the second conductivity type being embedded in a manner adjoining a first surface of the semiconductor body and the remaining region of the semiconductor body defining a body region, a depression being introduced in the body region between the drain region and the source region; a gate electrode, which is arranged at least partly in the depression and is insulated from the body region, the source region and the drain region by a gate dielectric. A first continuous region in the body region adjoins the drain region, the depression and the source region. A second region is arranged below the first region and adjoins the first region. The dopant concentration is lower in the first region than in the second region.

An arrangement of the second region below the first region denotes an arrangement in which the second region is arranged further away from the first surface than the first region.

The gate electrode, the gate dielectric and the body region together form a capacitor having a capacitance. In addition, capacitances also exist between gate and source, gate and drain, body region and source and body region and drain. These capacitances influence stored charges situated in the body region. The capacitance increases as the conductivity of the body region increases. The high conductivity of the body region is achieved by a high doping of the body region. The first conductivity type is opposite to the second conductivity type. The body region is preferably in one piece.

In or near to the pn depletion regions of the source and drain zones with the body region, electric fields are the cause of leakage currents of the injected charges into the source and drain zones. It has been recognized that the leakage currents are small in the case of pn electrical junctions with fields resulting from small dopant gradients. A small gradient is achieved by a low dopant concentration in these regions. In the bulk, by contrast, a high dopant concentration is maintained in order to form a maximum capacitance.

The depression in the first surface has a larger vertical dimensioning than the doped drain and source region. In other words, the depression extends deeper into the body region than the source and drain zone. A channel forms below the gate dielectric in the body region as in a conventional transistor. Since, according to the invention, the gate dielectric is arranged with the gate electrode in the trench, a channel results which has a length that is greater than the horizontal distance between the source and drain zones. This lengthened channel enables a better blocking behavior and thus reduced leakage currents between the source and drain zones and thus a lower power consumption of the semiconductor component.

A further advantage of the sunk gate electrode is that even injected charges which are situated far away from the source and drain zones still influence the channel and the threshold voltage of the transistor. This results firstly from geometrical considerations, since the gate electrode and the channel extend deeper into the body region. Secondly, the threshold voltage of a curved channel is more sensitive to injected charges in the body region. A semicylindrical, hemispherical or ellipsoidal surface is particularly preferred in this case.

The semiconductor memory component may have a plurality of first memory cells, in each first memory cell the gate electrode being connected to a word line and the drain region being connected to a bit line and the source regions of all the first memory cells being interconnected via a source line. This wiring enables operation of a random access memory via the bit and word lines. A block of first memory cells can be erased by applying a corresponding voltage to the source line.

The body region may be arranged on a semiconductor substrate of the second conductivity type, and in a third region of the body region adjoining the semiconductor substrate the dopant concentration is lower than in the second region. An insulating depletion layer forms by virtue of the opposite doping of the body region and of the semiconductor substrate. Said depletion layer has a capacitance which advantageously stores injected charges and localizes said charges remote from the source and drain regions. The dopant concentration of the body region is lowered in the vicinity of the depletion layer in order to keep the gradient of the dopant concentrations small and to minimize leakage currents of the injected charges into the semiconductor substrate.

A dielectric layer may be arranged between the body region of the memory cell and a semiconductor substrate. In this case, a capacitor structure comprising the body region, the dielectric layer and the semiconductor substrate forms without leakage currents being able to occur. The capacitor structure enables the storage of additional injected charges and a localization of the injected charges remote from the source and drain zones.

In one embodiment of the inventive semiconductor memory component, it is provided that in a fourth region of the body region adjoining the dielectric layer a dopant concentration is greater than in the second region. In one particularly preferred development, the dopant concentration increases within the fourth region radially from a central region of the fourth region. In this way, firstly a high specific capacitance is provided in the region of the vertical side areas of the body region adjoining the semiconductor substrate, said capacitance advantageously being far away from the source and drain zones. In addition, a reduction in the center of the fourth region prevents the dopants from migrating into the gate dielectric. Consequently, the dielectric properties of the gate dielectric have not been altered by the dopant.

In another embodiment of the inventive semiconductor memory component, it is provided that within a part of the second region the dopant concentration increases in the lateral direction proceeding from a central region of the second region.

One embodiment of the inventive semiconductor memory component provides for body regions of adjacent memory cells to be insulated from one another by an isolation trench filled with a dielectric.

The body regions of adjacent memory cells may be insulated from one another by an isolation trench, a continuously covering dielectric layer being applied on the sidewalls of the isolation trench and the isolation trench being at least partly filled with a conductive material. In this way, a further capacitor structure comprising the body region, the dielectric layer and the conductive material is formed along the sidewalls of the body region. A larger quantity of charge can thus be stored within the body region, and a longer storage duration results as a consequence. The capacitor structure preferably extends only along the sidewalls of the second and/or of the third region. It is not expedient to form the capacitor structure adjoining the first region in the vicinity of the source and drain zones since the leakage currents of the injected charges into the source and drain zones are large in these regions.

Contact-making areas may be applied on the drain regions and/or the source regions and may extend as far as over the isolation trench. These additional contact-making areas enable contact to be made with the source and drain zones above the isolation trenches and thus a reduction of the area requirement of the semiconductor component. A further advantage is that it is thereby possible to reduce the contact area of the source and drain zones with the body region, whereby the leakage currents of the injected charges are reduced.

The dielectric layer may have a high-k dielectric.

The gate dielectric may be thicker in a region near to the drain zone and the source zone than in a region between the drain zone and the source zone. A high insulation is thus achieved between the gate electrode and the source and drain zones. Moreover, the threshold voltage of the transistor is reduced on account of the thinner layer of the gate dielectric above the channel and the reliability properties have been improved.

BRIEF DESCRIPTION OF THE SEVERAL VIEWS OF THE DRAWINGS

FIGS. 3a-6a are partial cross sections of a semiconductor memory component in accordance with four embodiments of the present invention.

FIGS. 3b, 4b, 4c, 6b are diagrams for specifying doping profiles associated with the corresponding embodiments.

FIG. 5b is a further plan view of a semiconductor component in accordance with FIG. 5a.

DETAILED DESCRIPTION OF THE INVENTION

In the figures, identical reference symbols designate identical or functionally identical devices.

Figure 1:
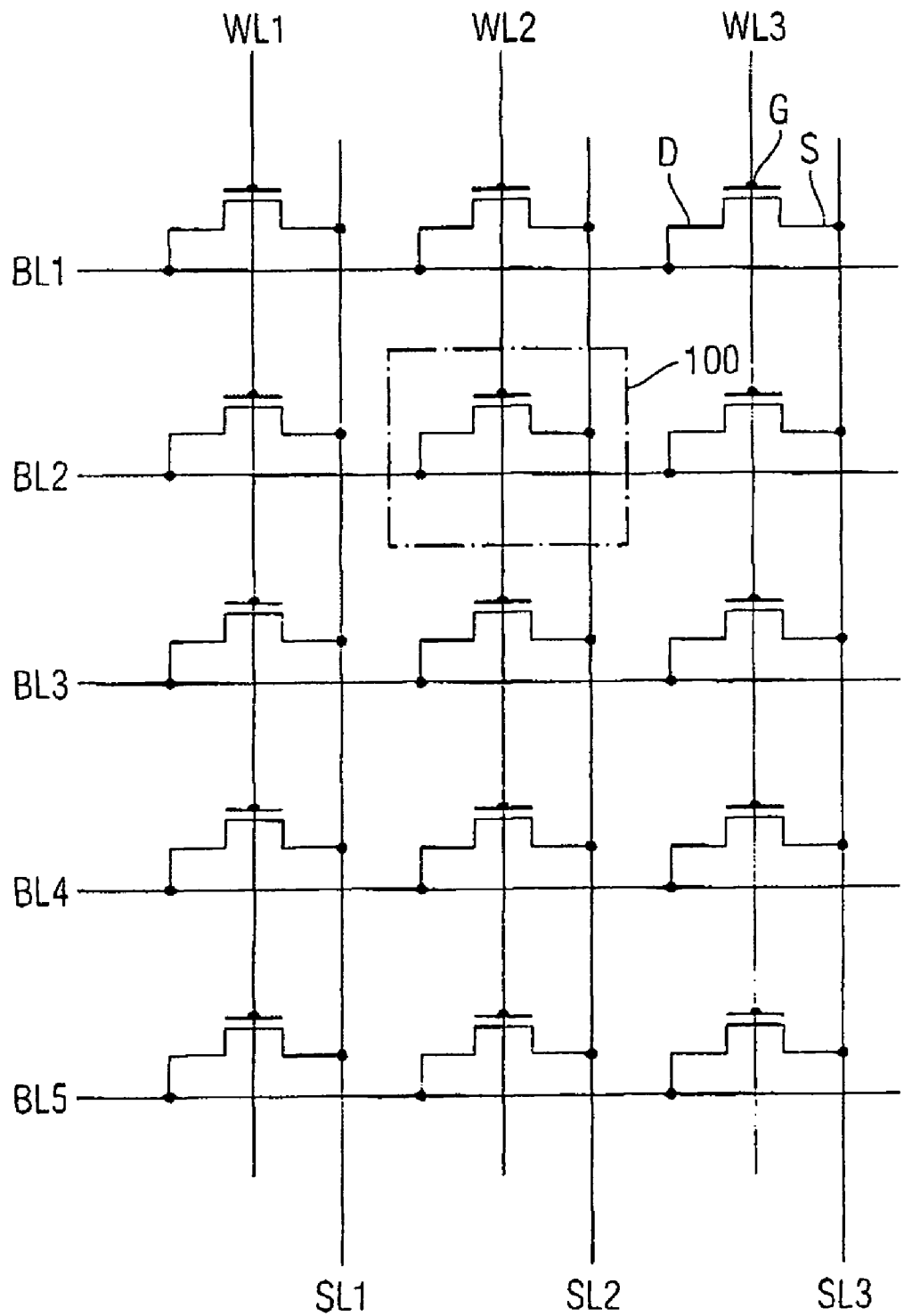
FIG. 1 is a schematic circuit diagram of one embodiment of the present invention.

FIG. 1 shows by way of example an arrangement of a multiplicity of memory cells 100 arranged in columns and rows, that is to say in matrixlike fashion. Each of the memory cells has a transistor having a gate G, a drain D and a source S. Drain D, gate G and source S are connected to a bit line BL1, BL2, ... (BL), a word line WL1, WL2, ... (WL) and a source line SL1, SL2, ... (SL), respectively. In the embodiment illustrated in FIG. 1, the word lines WL and the bit lines BL run perpendicular to one another, as is known generally in the case of random access memories. In the example illustrated, the source lines SL run parallel to the word lines WL; in another configuration, they may also run parallel to the bit lines BL. It should be noted that the source lines SL connects a plurality of memory cells 100 to one another via the source S. This is in contrast to random access memories which have a transistor and a capacitance. In these memory devices, the source of different memory cells are not electrically connected to one another, but rather are only connected to the respective capacitor of the memory cell.

The designation drain and source of a transistor is chosen arbitrarily. Hereinafter, drain will always designate the terminal of a transistor which is connected to a bit line, and source will always designate the terminal which is connected to a source line SL.

Figure 2:
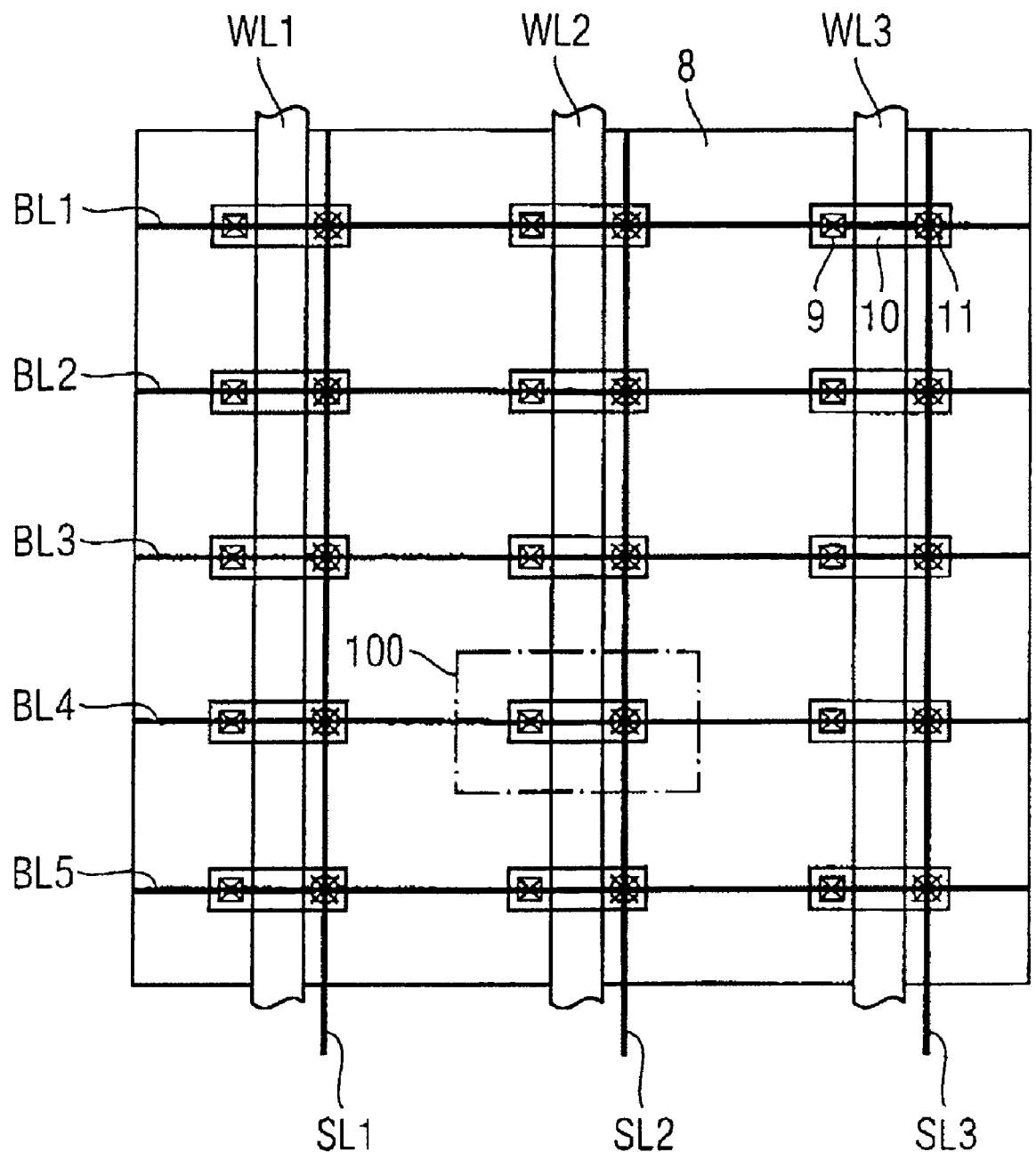
FIG. 2 is a plan view of a semiconductor component in accordance with one embodiment of the present invention.

FIG. 2 shows a plan view of one embodiment of a semiconductor memory component. A multiplicity of memory cells 100, as illustrated previously in the schematic circuit diagram, are arranged in matrix-type fashion. The active region of the transistors of the memory cells 100 is connected via a bit line contact 9, a word line contact 10 and a source line contact 11 to a bit line BL, a word line WL and a source line SL, respectively. The active regions of the transistors of different memory cells 100 are insulated from one another by isolation trenches 8.

A partial cross section through a semiconductor component in accordance with a first embodiment is illustrated in FIG. 3. A second semiconductor substrate 3 having a p-type doping is arranged on an n-type semiconductor substrate 1a.

A drain region 4 and a source region 5 are embedded at a distance from one another in the second semiconductor substrate 3, both regions adjoining a first surface 103 of the second semiconductor substrate. Both the drain region 4 and the source region 5 have an n-type doping. These two regions are preferably heavily doped. The remaining p-doped region of the second semiconductor substrate is referred to hereinafter as body region 3.

A depression 106 is introduced into the first surface 103 between the drain region 4 and the source region 5. In one preferred configuration, the vertical dimensioning of the depression 106 is greater than the thickness of the drain region 4 and of the source region 5. A gate electrode 7 reaches right into said depression 106. The gate electrode is insulated by a layer with a gate dielectric 6 from the body region 3 and the source and drain zones 4 and 5.

A channel forms below the gate dielectric 6 in the body region 3 between the drain region 4 and the source region 5 as in a conventional transistor. As a result of the gate electrode 7 being sunk into the body region 3, the channel is longer than the horizontal connecting line between the drain region 4 and the source region 5. A better blocking behavior of the transistor advantageously results on account of the longer channel. In this way, there is a reduction of the leakage currents between the drain zone 4 and the source zone 5 during operation of the semiconductor memory component and the average power consumption of the semiconductor memory component is thus reduced.

The functional principle of a memory cell having the transistor just described is explained below. Parasitic effects such as e.g. impact ionization within the channel or a gate-induced drain current inject charges into the body region 3. In the illustrated exemplary embodiment with a p-doped body region, said charges are so-called holes. These excess injected charges in the body region influence the switching behavior of the transistor by virtue of their electric fields. In particular, it is found that the threshold voltage of the transistor increases by several hundred millivolts in the case of injected charges. Two or more states of the transistor can be defined as memory states which are differentiated on the basis of different threshold voltages. In one variant, it is possible e.g. to apply a voltage to the gate electrode 7 which corresponds to a threshold voltage of the transistor with injected charges. In a first memory state with injected charges, the channel is then activated in conducting fashion, and in a second memory state without injected charges the channel is blocking or at high impedance.

Charges can be injected into the body region 3 by means of a current flowing between the drain region 4 and the source region 5. As a parasitic secondary effect, charges form as a result of impact ionization within the channel and are then injected into the body region 3. A memory thus requires a sufficiently long current flow through the channel.

A further method of injecting charges into the body region 3 consists in applying a negative voltage to the gate electrode and/or a positive voltage to the drain. Given a sufficiently large potential difference between drain and gate, charge carriers are injected into the body region 3 on account of a quantum mechanical tunnel effect. Source is grounded in this case. In an advantageous manner, no current flows between drain and source during this injection of the charges, and the power consumption is thus low.

The memory cell is erased by applying a negative voltage to the source region 5. The injected charges then flow away via the source line SL.

Only a small quantity of injected charge is necessary for shifting the threshold voltage by several hundred millivolts. However, the problem arises of keeping the quantity of charge within the body region 3 for a sufficiently long time. The depletion zones that form between the body region 3 and the drain region 4 and, respectively, the source region 5 have been identified as a primary loss channel. It is found in this case that a shallow doping gradient in the depletion zone regions leads to a smaller leakage current of the injected charges in the drain or source region 4, 5. Therefore, in a region 201 near to the first surface 103 of the body region 3, only a dopant concentration of the p type is low, at least lower than in the region 200 of the body region 3 underneath.

Figures 3A, 3B:
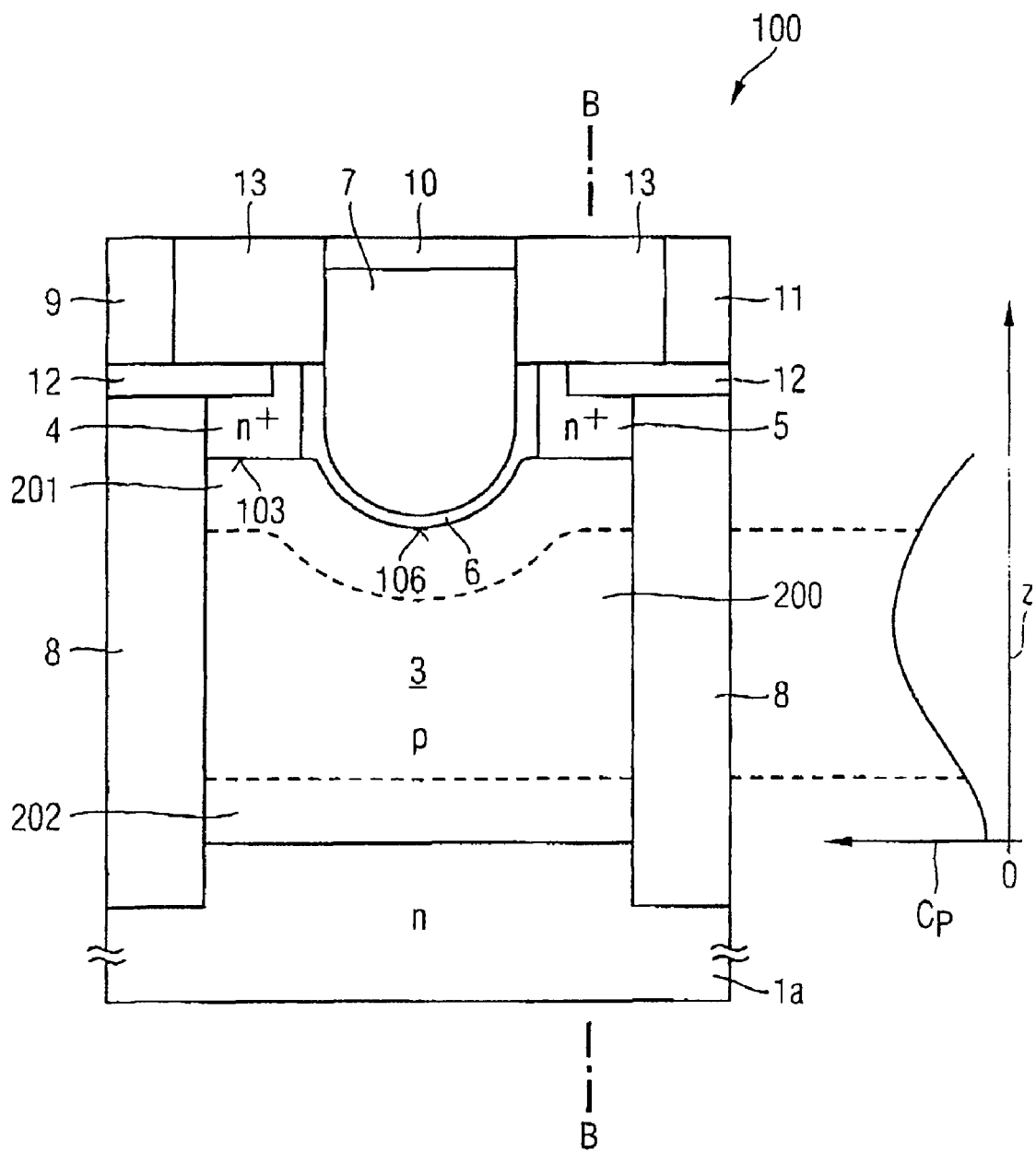

In a bulk region 200 of the transistor body 3, the concentration cp of the p-type dopant is increased, as illustrated schematically in FIG. 3b. FIG. 3b shows the dopant concentration along the cross-sectional area B-B. The increase in the doping enables a greater capacitance of the body region 3 together with the gate electrode 7 and the gate dielectric 6.

In an advantageous manner, the dopant concentration is also reduced in the vicinity of the channel in order to avoid a migration of the dopant into the gate dielectric and an associated reduction of the insulation effect of the gate dielectric.

An additional capacitance forms between the body region 3 and the semiconductor substrate 1a. On account of the sunk gate electrode, charges which are stored in the vicinity of the semiconductor substrate 1a also influence the threshold voltage of the transistor.

The depletion region between the semiconductor substrate 1a and the body region 3 is a further possible loss channel for the injected charges. The leakage current into the substrate 1a is reduced by reducing the dopant concentration of the p-type dopant in the semiconductor substrate 3 in a region 202 near to the semiconductor substrate. Said region 202 having a reduced dopant concentration is illustrated schematically in FIG. 3a in connection with FIG. 3b.

The body region 3 is insulated from body regions 3 of other memory cells 100 and laterally delimited by isolation trenches 8. The isolation trenches 8 extend completely over the entire length of the sidewalls of the body region 3. This ensures that the body region 3 has no conductive connection to its surroundings. The isolation trenches 8 may additionally also extend right into the semiconductor substrate 1a.

Contact is made with the gate electrode 7 by means of a gate contact 10 or directly by means of the word line WL, contact is made with the drain region 4 by means of a bit line contact 9, and contact is made with the source zone 5 by means of a source line contact 11. A contact area 12 extending as far as over the isolation trench 8 may be arranged on the drain region 4. Consequently, the drain region 4 may be formed such that it is narrower than the bit line contact 9. The reduced lateral dimensioning of the drain region 4 simultaneously reduces the leakage current of the injected charges from the body region 3 into the drain region 4. In an analogous manner, a contact area 12 extending over the isolation trenches 8 may also be arranged on the source region 5.

The isolation trenches 8 are filled with a dielectric. Further cavities 13 may be filled with further insulation materials.

The thickness of the gate dielectric may be uniform. In an advantageous manner, however, it is thicker adjoining the source and drain zones in order to achieve a high insulation effect and to increase the reliability properties of the gate location, and thinner between the two regions in order to minimize the threshold voltage of the transistor.

A second embodiment of a memory cell of the semiconductor component is described in connection with FIGS. 4a, 4b and 4c. Only the differences with respect to the previous exemplary embodiment will be discussed in this case. The semiconductor substrate 1b is insulated from the body region 3 by a dielectric layer 2b. This has the effect that there is no leakage current of the injected charges from the body region 3 into the semiconductor substrate 1b. Therefore, it is possible to introduce a high dopant concentration cp of the p-type dopant 203 in the body region near to the semiconductor substrate 1b in these regions as well. The capacitance formed by the semiconductor substrate 1b, the dielectric layer 2b and the body region 3 is increased in this way. A corresponding doping profile along the line B-B is illustrated in FIG. 4c.

Damage to the gate dielectric 6 may be prevented by reducing the dopant concentration along a vertical center line with respect to the edge regions. A corresponding dopant profile is represented along the line A-A in FIG. 4b. This results in pocket-type dopant regions adjoining the sidewalls of the body region 3 and adjoining the semiconductor substrate 1b.

Figure 5A:
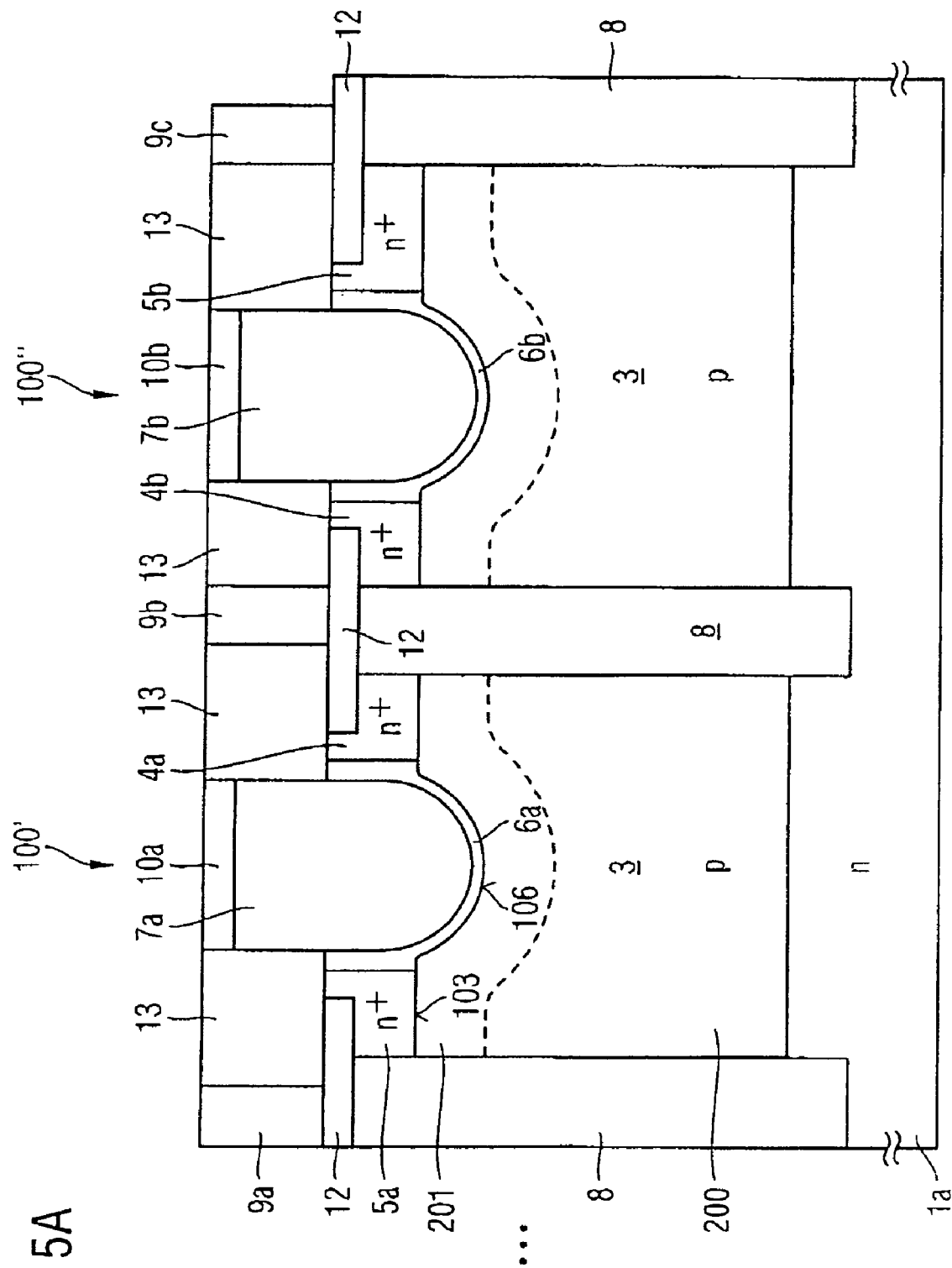

FIG. 5a shows a possible arrangement of two adjacent memory cells. In this case, a drain region 4a of one memory cell 100' and a drain region 4b of a second memory cell 100" share a common contact-making area 12. This enables a further reduction of the area requirement with respect to the arrangement as illustrated in FIG. 2.

FIG. 5b shows a plan view of the semiconductor component in accordance with a further embodiment of the present invention according to the partial cross section in FIG. 5a. As can be seen from FIG. 5a, the source regions 5a, 5b and drain regions 4a, 4b are arranged in interchanged fashion relative to the respective isolation trenches 8 or bit line contacts. The two memory cells 100', 100" in FIG. 5a thus correspond to the corresponding memory cells 100', 100" which are assigned to the word lines WL2, WL3 in FIG. 5b. Overall, this results in a significant reduction of the chip area since the drain lines can now be arranged very close to one another relative to the bit line contact 9b.

Figures 6A, 6B:
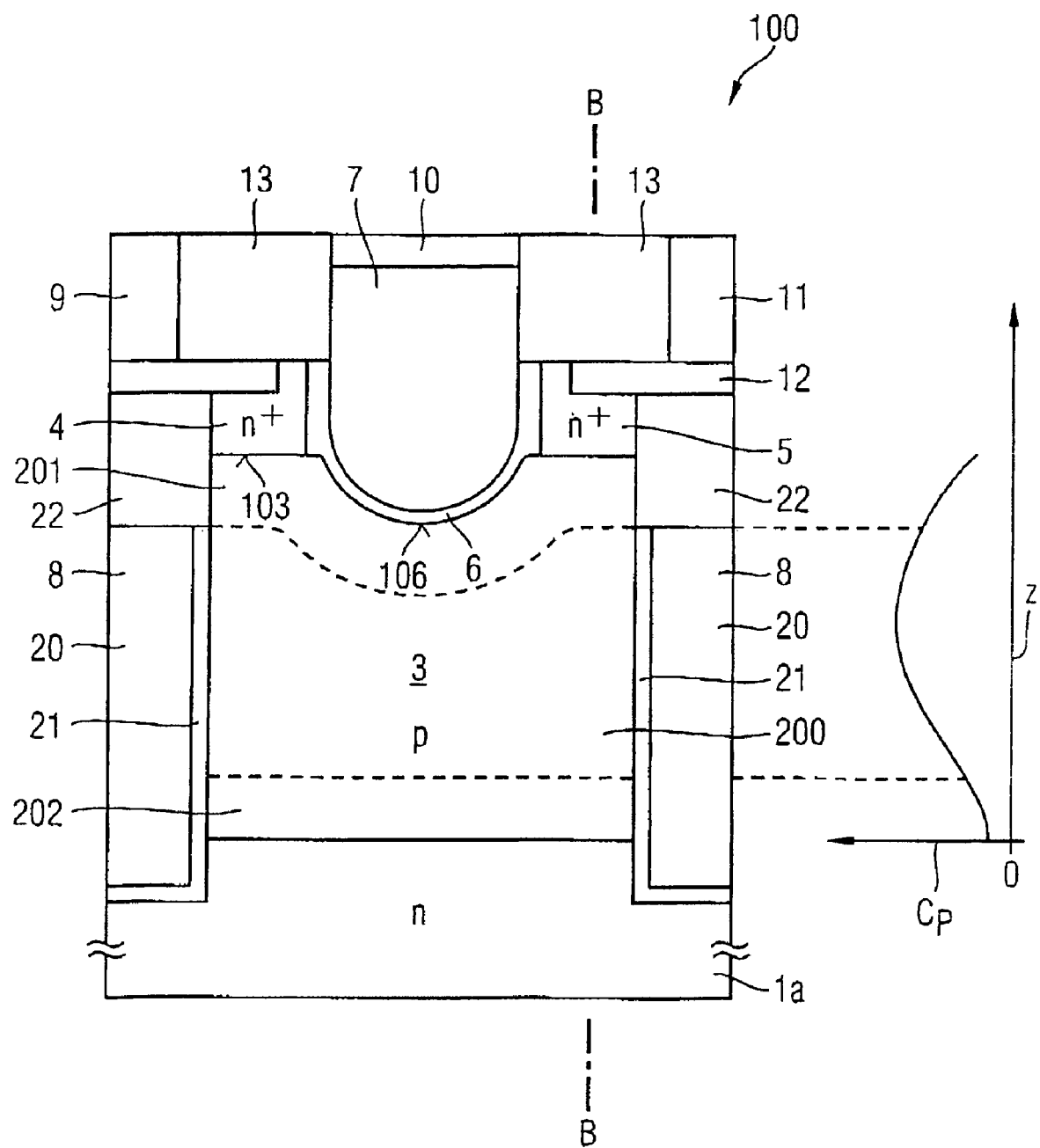

FIG. 6a shows a partial section through a memory cell 100. A thin dielectric layer 21 is applied on the sidewalls in the isolation trench 8. The trenches are at least partly filled with a conductive material 20. A further capacitor structure formed by the body region 3, the dielectric layer 21 and the conductive material 20 is provided in this way. The trench 8 is preferably filled with the conductive material 20 only up to a height which corresponds to the height at which the upper region 201 of the semiconductor body 3 adjoins the bulk region 200 of the body region 3. Consequently, the capacitor structure does not extend right into a region adjoining the source and drain regions, in order to avoid leakage currents along the capacitor structure into the source and drain regions.

Although the present invention has been described on the basis of preferred exemplary embodiments, it is not restricted thereto.

In particular, the conductivity types of the doped regions can be exchanged for the opposite conductivity type, in which case at the same time the correspondingly inverted voltage potentials must be applied.

A voltage can be applied to the semiconductor substrate 1a, 1b in order to store the injected charges in the body region 3 in an intensified manner.

The trench 8 and a capacitor structure formed therein may be common to all the memory cells 100 or be subdivided in rows and/or in columns.

Although modifications and changes may be suggested by those skilled in the art, it is the intention of the inventor to embody within the patent warranted hereon all changes and modifications as reasonably and properly come within the scope of his contribution to the art.

What is claimed is:

1. A semiconductor memory component comprising at least one memory cell; said memory cell comprising:
 a semiconductor body comprised of a body region, a drain region and a source region; said body region comprising a first conductivity type and a depression between said source and drain regions, and said source and drain regions comprising a second conductivity type; body regions of adjacent memory cells are insulated from one another by an isolation trench configured to isolate the respective body regions of the adjacent memory cells along a bit line;
 a gate dielectric; and
 a gate electrode arranged at least partly in said depression and being insulated from said body, source, and drain regions by said gate dielectric;
 said body region further comprising a first continuous region with a first dopant concentration and a second continuous region with a second dopant concentration greater than said first dopant concentration; said first continuous region adjoining said drain region, said depression and said source region, and said second region being arranged below said first region and adjoining said first region.

2. The semiconductor memory component of claim 1, comprising a semiconductor substrate with a region of said second conductivity type on which said body region is arranged; wherein said body region comprises a further region adjoining said region of the second conductivity type and having a dopant concentration lower than said second dopant concentration.

3. The semiconductor memory component of claim 1, comprising a dielectric layer, arranged between said body region and a semiconductor substrate.

4. The semiconductor memory component of claim 3, wherein said body region comprises a further region adjoining said dielectric layer and having a dopant concentration greater than said second dopant concentration.

5. The semiconductor memory component of claim 4, wherein said dopant concentration of said further region increases in the lateral direction proceeding from a central region.

6. The semiconductor memory component of claim 1, wherein said second dopant concentration increases in the lateral direction proceeding from a central region of said second continuous region.

7. The semiconductor memory component of claim 1, wherein the isolation trench is at least partially filled with a dielectric material.

8. The semiconductor memory component of claim 7, comprising contact-making regions extending onto said isolation trench; said contact-making region being at least applied on said drain regions or on said source regions.

9. The semiconductor memory component of claim 1, wherein said isolation trench is at least partially filled with a conductive material, a dielectric layer being disposed between the body region and the conductive material.

10. The semiconductor memory component of claim 9, comprising contact-making regions extending onto said isolation trench; said contact-making region being at least applied on said drain regions or on said source regions.

11. The semiconductor memory component of claim 1, wherein said gate dielectric is thicker in a region close to said drain or said source region than in a region in between said source and drain regions.

12. The semiconductor device of claim 1, further comprising:
 a plurality of memory cells; and
 a plurality or word lines, bit lines and source lines,
 wherein for each of the memory cells, the gate electrode is connected to one of the word lines, the drain region is connected to one of the bit lines, and the source region is connected to one of the source lines.

13. The semiconductor memory component of claim 1, wherein the gate dielectric layer comprises a single layer of gate dielectric material.

14. The semiconductor memory component of claim 12, wherein the individual word line is parallel to the source line and perpendicular to the individual bit line.

15. The semiconductor memory component of claim 12, wherein the individual word lines and the source line are running into the same direction.

* * * * *